(12) United States Patent
Wiegner et al.

(10) Patent No.: US 7,388,428 B2
(45) Date of Patent: Jun. 17, 2008

(54) POWER AMPLIFIER WITH CONTROLLABLE FEEDBACK LOOP

(75) Inventors: Dirk Wiegner, Schwaikheim (DE); Thomas Merk, Fellbach (DE)

(73) Assignee: ALCATEL, Paris (FR)

( * ) Notice: Subject to any disclaimer, the term of this patent is extended or adjusted under 35 U.S.C. 154(b) by 64 days.

(21) Appl. No.: 11/289,567

(22) Filed: Nov. 30, 2005

(65) Prior Publication Data

US 2006/0114059 A1 Jun. 1, 2006

(30) Foreign Application Priority Data

Dec. 1, 2004 (EP) .................................. 04292850

(51) Int. Cl.
*H03G 3/30* (2006.01)

(52) U.S. Cl. ..................... 330/86; 330/282; 330/294

(58) Field of Classification Search ................. 330/86, 330/282, 294

See application file for complete search history.

(56) References Cited

U.S. PATENT DOCUMENTS 5,051,705 A * 9/1991 Moghe et al. .............. 330/277
5,786,730 A * 7/1998 Hadley ....................... 330/59
6,118,991 A   9/2000 Jean et al.
6,285,257 B1 * 9/2001 Abe et al. ................... 330/282
2001/0036816 A1  11/2001 Wieck
2003/0045252 A1   3/2003 Nam
2004/0085138 A1   5/2004 Franca-Neto

* cited by examiner

*Primary Examiner*—Steven J Mottola
(74) *Attorney, Agent, or Firm*—Sughrue Mion, PLLC

(57) ABSTRACT

The present invention relates to a power amplifier for amplifying an electronic input signal (51) and a multi-band capable frontend with such power amplifier. The power amplifier comprises an amplifier transistor stage (1) having an input (52) and an output (53) and a feedback loop (4) placed between the output (53) and the input (52) of the amplifier transistor stage (1). The feedback loop (4) comprises a capacitor (41) and a resistive element (44) in a RF path and an inductive element (42) in a DC feed path, wherein said resistive element comprises a feedback transistor (45) arranged as variable resistor within the feedback loop, and a bias control circuit (46).

9 Claims, 4 Drawing Sheets

POWER AMPLIFIER WITH CONTROLLABLE FEEDBACK LOOP

The invention is based on a priority application EP 04292850.7 which is hereby incorporated by reference.

FIELD OF THE INVENTION

The present invention relates to a power amplifier for amplifying an electronic input signal as well as a multi-band capable front-end equipped with such power amplifier.

BACKGROUND OF THE INVENTION

Power amplifiers are widely employed in the telecommunications industry. Telecommunication applications, such as UMTS, WiMAX, high data rate fiber transmission system or microwave systems need power amplifiers that have the ability to amplify wideband signals, e.g. spread spectrum signals in an efficient manner. Since wideband power amplifiers often show gain variations versus the used frequency range, it is difficult to provide the same output power for several frequency bands that shall be covered by the power amplifier.

For example, variable attenuators are used to compensate the gain variations versus frequency.

SUMMARY OF THE INVENTION

The object of the present invention is achieved by a power amplifier for amplifying an electronic input signal, the power amplifier comprising an amplifier transistor stage having an input and an output and a feedback loop placed between the output and the input of the amplifier transistor stage, wherein said feedback loop comprises a capacitor and a resistive element in a RF path and an inductive element in a DC feed path, and wherein said resistive element comprises a feedback transistor arranged as variable resistor in the feedback loop and a bias control circuit (RF=Radio Frequency; DC=Direct Current). Further, the present invention is directed to a multi-band capable frontend for base transmit stations or user terminals like e.g. multiband-/multistandard capable mobile phones, comprising one or more such power amplifiers.

Due to the use of the feedback transistor within the RF path of the aforementioned feedback loop having in addition a capacitor in the RF path and an inductive element in the DC feed path, a certain gain and stability control of the amplifier can be achieved. This gain and stability control is sufficient to compensate gain variation versus the used frequency range. Such a feedback loop is used to adjust the output power at different frequency bands. The invention improves gain versus frequency behavior of wideband power amplifiers (e.g. within the preamplification chain) and thus improves output power behavior of multi-band capable frontends, for example UMTS base stations or mobile terminals. Further, the invention makes it possible to save variable attenuators or up to now conventional used variable gain amplifier stages within the amplification chain of multi-band capable frontends and thereby provides a robust and cheap solution of the gain variation problem.

Further advantages of the invention are achieved by the embodiments of the invention indicated by the dependent claims.

The bias control circuit biases the feedback transistor with different input voltages. Thereby, the bias control circuit adapts the feedback loop and thus the power amplifier to the specific frequency band of the electronic input signal.

Preferably, the power amplifier comprises a look-up table storing different bias voltages corresponding to different frequency ranges of the electronic input signal. For example, the values of the look-up table covers frequency ranges at 1.8 GHz up to 2.7 GHz. The bias control circuit accesses the look-up table and applies a bias voltage on the feedback transistor that complies with the respective bias voltage value of the look-up table.

Preferably, the bias control circuit has an input for receiving a control signal indicating the frequency band of the electronic input signal. This control signal can be generated by a subordinate control unit of the front end. Further, the control signal can be influenced by a jumper or switch that is set during the installation of the power amplifier.

According to a further embodiment of the invention, the bias control circuit determines the frequency band of the electronic input signal of the power amplifier and selects a correspondent bias voltage value from the look-up table by means of such determined data.

According to a further embodiment of the invention, the bias control circuit analyzes the output signal of the amplifier transistor stage and automatically adapts the bias voltage to achieve a predefined gain.

Preferably, the amplifier transistor stage comprises one or more amplifier transistors adapted to amplify an electronic signal of high frequency, in particular of a frequency greater than 1 GHz. For example, the power amplifier transistor stage comprises a field-effect-transistor or two or more such transistors placed in parallel.

Preferably, the RF path of the feedback loop comprises a further inductive element used to adapt the feedback loop to the characteristics of the feedback transistor and/or amplifier transistor stage.

BRIEF DESCRIPTION OF THE DRAWINGS

These as well as other features and advantages of the invention will be better appreciated by reading the following detailed description of presently preferred exemplary embodiments taken in conjunction with accompanying drawings of which.

DETAILED DESCRIPTION OF THE INVENTION

Figure 1:
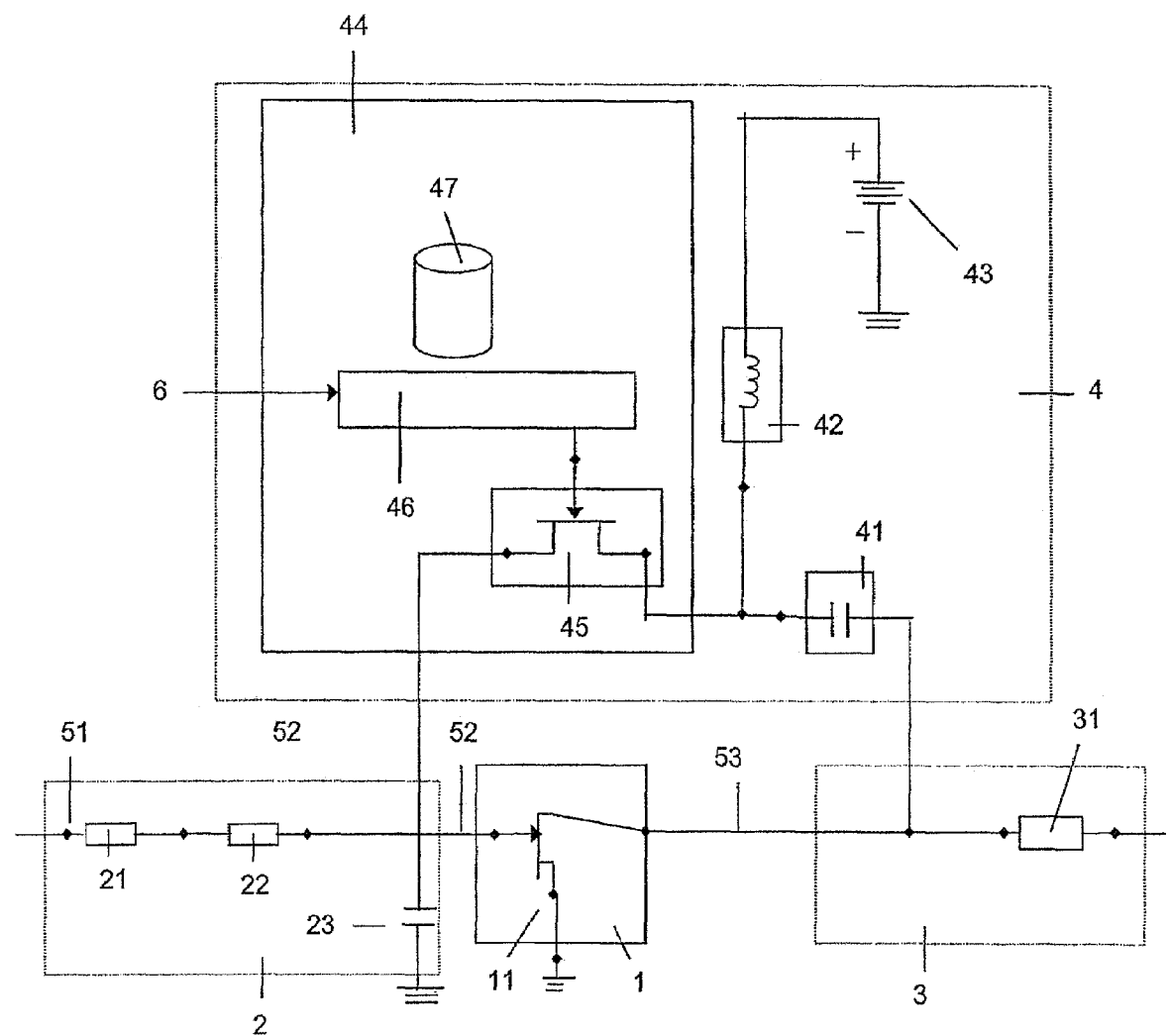
FIG. 1 is a block diagram for power amplifier according to the present invention.
Figure 2:
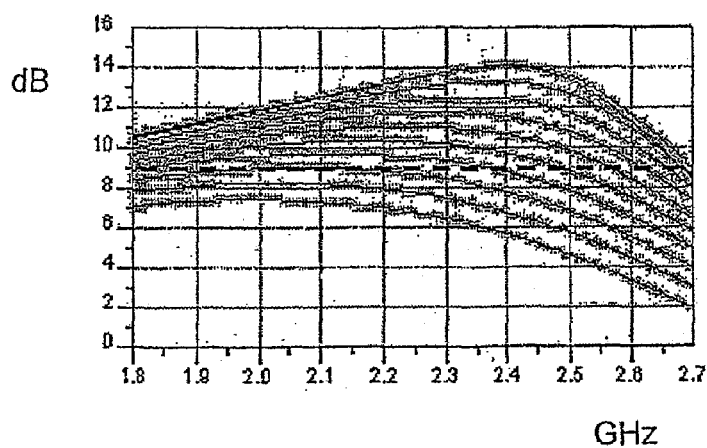
FIG. 2 is a diagram showing signal gain versus frequency.
Figure 3:
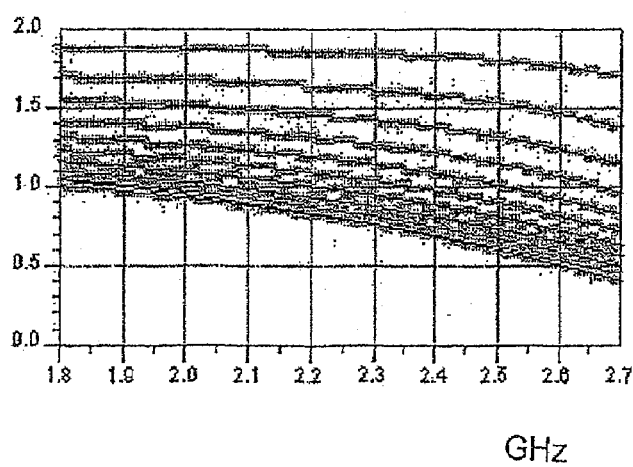
FIG. 3 is a diagram showing the K-factor versus frequency.
Figure 4:
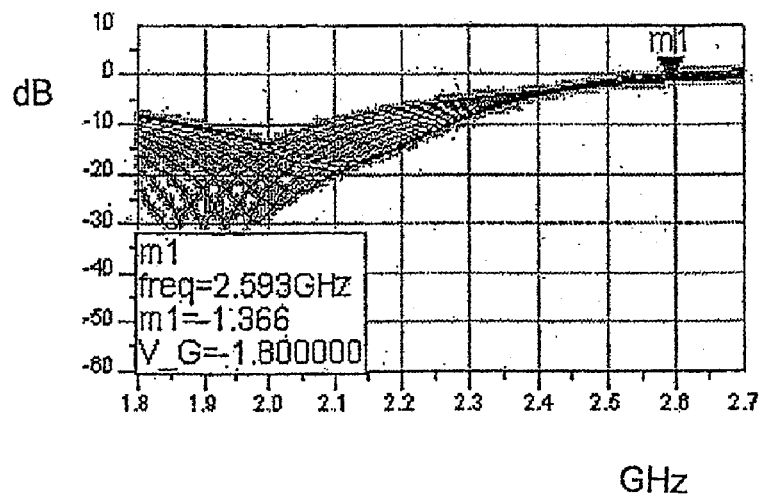
FIG. 4 is a diagram showing input reflection versus frequency.
Figure 5:
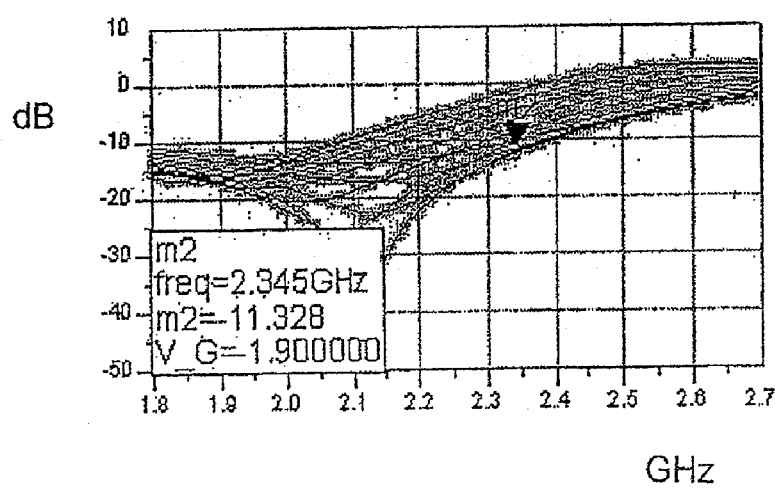
FIG. 5 is a diagram showing output reflection versus frequency.
Figure 6:
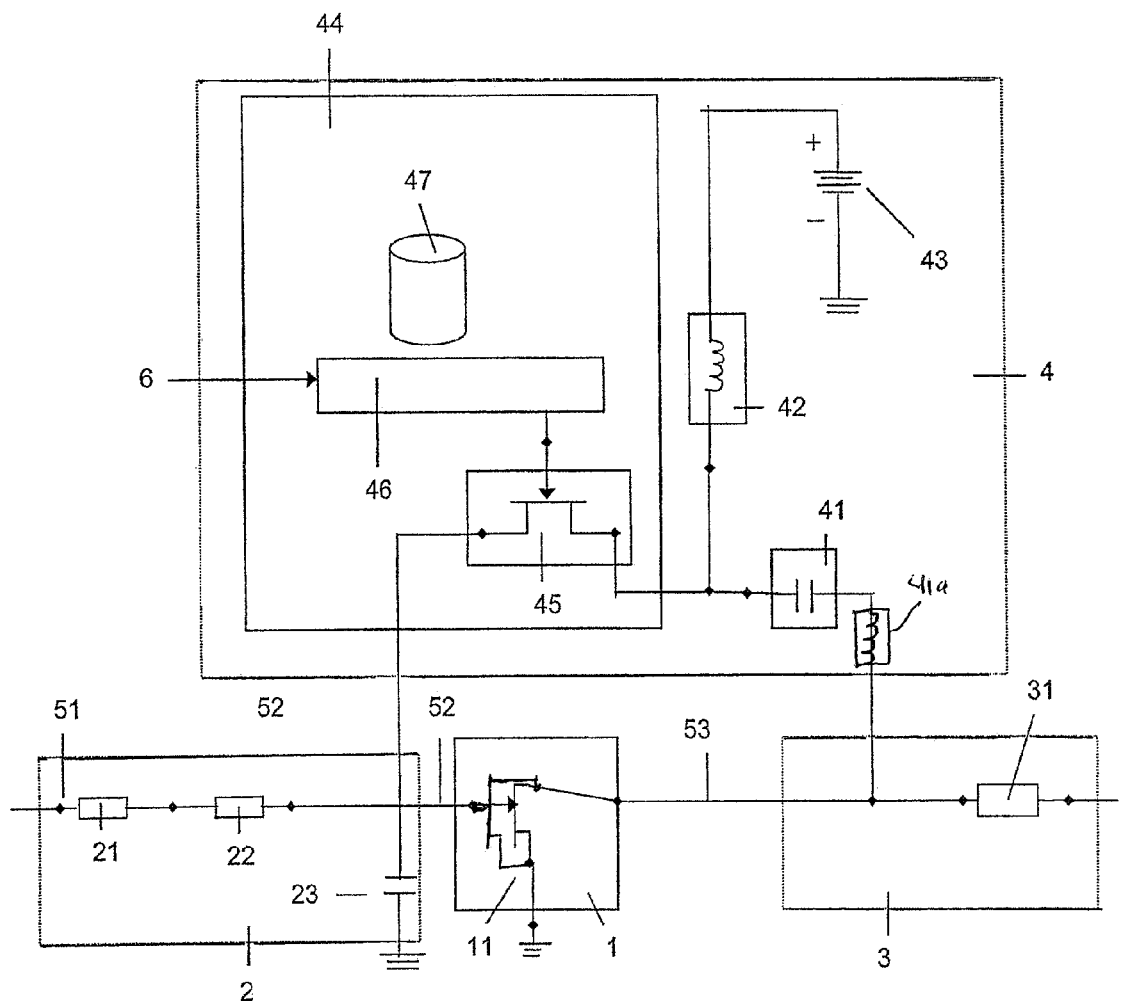
FIG. 6 is a block diagram for an alternative embodiment of a power amplifier according to the present invention, showing parallel-connected amplifier transistors and a further inductive element 41a in the RF path of the feedback loop.

FIG. 1 shows a wideband power amplifier amplifying an electronic input signal 51, the power amplifier having an amplifier transistor stage 1, an input matching network 2, an output matching network 3 and an feedback loop 4.

The input matching network 2 and the output matching network 3 are adaptation networks adapting the input/output behavior of the power amplifier to the neighboring components of the amplification chain. For example, the input matching network comprises here two transmission lines 21 and 22 and a capacitor 23. For example, the output matching network 3 comprises here a transmission line 31.

The amplifier transistor stage 1 comprises a field-effect-transistor 11. The gate of the field-effect-transistor 11 is connected with the input matching network 2. The drain of the field-effect-transistor 11 is connected with the output matching network 3. Further, it is possible that the amplifier transistor stage 1 comprises two or more field-effect-transistors placed in parallel to improve the RF output power that can be provided by the amplifier transistor stage.

Further, it is possible to use other kinds of transistors as amplification transistors, e.g bipolar transistors.

The amplifier transistor stage 1 has an input 52 and an output 53. The feedback loop 4 is placed between this output 53 and this input 52 of the amplifier transistor stage. The feedback loop 4 has a capacitor 41 and a feedback transistor 45 in the RF path. In order to block the DC from the RF path, an inductive element 42 is used in the DC feed path.

The one terminal of the capacitor 41 is connected with the output 53 of the amplifier transistor stage 1. The other terminal of the capacitor 41 is connected with the drain of the feedback transistor 45 and with the inductive element 42 in the DC feed path. The source of the feedback transistor 45 is connected with the input 52 of the amplifier transistor stage 11. The other terminal of the inductive element 42 is connected with a supply voltage 43. The gate of the feedback transistor 45 is connected with the bias control circuit 46.

The capacitor 41 blocks the DC voltage applied on the feedback loop 4. The inductive element 42 blocks the RF signal from the DC feed. For example, the inductive element is a λ/4 line coupled with a capacitor.

The bias control circuit 46 biases the feedback transistor 45 with different input voltages. Preferably, the input voltage applied by the bias control circuit 46 depends on the frequency band of the electronic input signal 51.

For example, the power amplifier exemplified by FIG. 1 is a multi-band power amplifier for a micro BTS (Node B) of a UMTS communication system (BTS=Base Transceiver Station; UMTS=Universal Mobile Telecommunications System). It covers several frequency bands, for example the band from 1.8 to 2.0 GHz and from 2.5 to 2.7 GHz.

A suitable biasing voltage of the feedback transistor can either be adjusted by using a look-up table containing a gate voltage for each frequency band or adaptive by analyzing the output signal of the amplifier.

FIG. 2 to FIG. 5 show the signal gain, the K-factor, the input reflection and the output reflection versus frequency for different bias voltages. Dependent on the frequency band that has to be served by the power amplifier, the bias control circuit applies a specific bias voltage at the gate of the feedback transistor 45.

For example, a look-up table 47 stores different bias voltage values corresponding to different frequency ranges.

Within an initialization step, correspondent bias voltage values are determined for each of the frequency ranges that shall be served by the power amplifier. The selected bias voltage value depends on the signal gain, K-factor, input reflection and output reflection usable for the operation at the respective frequency band. For example, the K-factor has to have a value greater than 1 and the signal gain has to have a preset minimum value. The quality of the in- and output matching will also be effected by the feedback loop 4, therefore the input and output reflection has be taken into account when choosing the biasing range of the feedback transistor. The bias voltage values are then selected, e.g. by means of diagrams as FIG. 2 to FIG. 5 calculated by simulation or by measurement.

The bias control circuit 46 converts the digital bias voltage value of the look-up table 47 to an analog bias voltage applied at the gate of the feedback transistor 45, for example by means of a digital/analog converter.

For example, the bias control circuit receives a control signal 6 indicating the frequency band of the electronic input signal 51. The bias control circuit 46 accesses the look-up table 47, selects the bias voltage value linked with the frequency band indicated within the control signal 6 and applies a bias voltage at the gate of the feedback transistor 45 that corresponds with the selected bias voltage value of the look-up table 47.

According to a further embodiment of the invention, the bias control circuit 46 determines the frequency band of the electronic input signal 51, for example by means of a band-pass filter bank.

According to a further embodiment of the invention, the bias control circuit is connected via a further feedback loop with the output 53 of the amplifier transistor stage 1. Through this feedback loop, the bias control circuit determines the signal level of the output signal and adapts the bias voltage supplied to the feedback transistor 45 in such way that the average signal level at the output 53 is set within predefined thresholds.

It is possible to integrate the two transistors, the amplifying transistor 11 and the feedback transistor 45 on a single chip with four connectors leading through the package. The four connectors are used to connect the capacitor 41 and the inductive element 42. In this way the designer has every choice for using a suitable DC blocking capacitor.

The invention claimed is:

1. Power amplifier for amplifying an electronic input signal, the power amplifier comprising an amplifier transistor stage having an input and an output, and a feedback loop placed between the output and the input of the amplifier transistor stage, wherein said feedback loop comprises a capacitor and a resistive element in a RF path and an inductive element in a DC feed path, wherein said resistive element comprises a feedback transistor arranged as variable resistor within the feedback loop and a bias control circuit, wherein the one terminal of the capacitor is connected with the output of the amplifier transistor stage and the other terminal of the capacitor is connected with the feedback transistor and with the inductive element, and wherein the bias control circuit is adapted to bias the feedback transistor with different input voltages.

2. The power amplifier of claim 1, wherein the power amplifier comprises a look-up table with different bias voltage values corresponding to different frequency ranges of the electronic input signal, and that the bias control circuit is arranged to access the look-up table and to apply a bias voltage on the feedback transistor that complies with the bias voltage values of the look-up table.

3. The power amplifier of claim 1, wherein the bias control circuit has an input for receiving a control signal indicating the frequency band of the electronic input signal and that the bias control circuit is arranged to adjust the bias voltage to the indicated frequency band.

4. The power amplifier of claim 1, wherein the bias control circuit is arranged to determine the frequency band of the electronic input signal.

5. The power amplifier of claim 1, wherein he bias control circuit is arranged to analyze the output signal of the amplifier transistor stage and automatically adapts the bias voltage.

6. The power amplifier of claim 1, wherein the amplifier transistor stage comprises one or more amplifier transistors adapted to amplify an electronic input signal of high frequency, in particular of a frequency greater than 1 GHz.

7. The power amplifier of claim 1, wherein the feedback loop further comprises a further inductive element in the RF path.

8. The power amplifier of claim 1, wherein the amplifier transistor stage comprises two or more transistors placed in parallel.

9. Multi-band capable frontend comprising one or more power amplifiers for amplifying an electronic input signal, the power amplifier comprising an amplifier transistor stage having an input and an output, and a feedback loop placed between the output and the input of the amplifier transistor stage, wherein said feedback loop comprises a capacitor and a resistive element in a RF path and an inductive element in a DC feed path, wherein said resistive element comprises a feedback transistor arranged as variable resistor within the feedback loop and a bias control circuit, wherein the one terminal of the capacitor is connected with the output of the amplifier transistor stage and the other terminal of the capacitor is connected with the feedback transistor and with the inductive element, and wherein the bias control circuit is adapted to bias the feedback transistor with different input voltages.

* * * * *